United States Patent [19]
Nguyen

[11] Patent Number: 5,973,569
[45] Date of Patent: Oct. 26, 1999

[54] SHORT-CIRCUIT PROTECTION AND OVER-CURRENT MODULATION TO MAXIMIZE AUDIO AMPLIFIER OUTPUT POWER

[75] Inventor: Huey Nguyen, San Jose, Calif.

[73] Assignee: National Semiconductor Corporation, Santa Clara, Calif.

[21] Appl. No.: 09/030,633

[22] Filed: Feb. 25, 1998

[51] Int. Cl.[6] .............................. H02H 7/20; H03F 3/38; H03F 3/217
[52] U.S. Cl. ............................ 330/298; 330/10; 330/251
[58] Field of Search .................................. 330/10, 207 A, 330/251, 207 P, 298, 146

[56] References Cited

U.S. PATENT DOCUMENTS

| | | | |
|---|---|---|---|
| 5,510,753 | 4/1996 | French | 330/146 |
| 5,805,020 | 9/1998 | Danz et al. | 330/10 |

*Primary Examiner*—Robert Pascal
*Assistant Examiner*—Patricia T. Nguyen
*Attorney, Agent, or Firm*—Skjerven, Morrill, MacPherson, Franklin & Friel LLP; Edward C. Kwok

[57] ABSTRACT

A Class D amplifier includes a tracking circuit and a regulation circuit to provide efficient, accurate protection against excessive current flow in the power FET's of the amplifier output stage. The FET currents flowing in the output stage are mirrored across tracking resistors by the tracking circuit. The resultant voltage drops are compared to reference voltages to detect over-current situations. By mirroring scaled-down versions of the output currents, power consumption in the tracking circuit is minimized. When an over-current situation is detected, the regulation circuit modulates the duty cycle of the signal input to the output stage until the FET currents fall to acceptable levels. If two over-current indications occur during a single clocking cycle of the pulse-width modulator of the amplifier, the regulation circuit shuts off the amplifier to protect against short-circuit damage.

10 Claims, 4 Drawing Sheets

SHORT-CIRCUIT PROTECTION AND OVER-CURRENT MODULATION TO MAXIMIZE AUDIO AMPLIFIER OUTPUT POWER

BACKGROUND OF THE INVENTION

1. Field of the Invention

The present invention relates to Class D electronic amplifiers, and in particular, to amplifier output stage over-current protection circuits.

2. Discussion of the Related Art

In a Class D amplifier, a pulse-width modulator (PWM) converts an incoming signal into a high-frequency rectangular wave, the average value of which tracks the incoming signal magnitude. This rectangular wave is fed to a set of power FET's, which provide an output signal that is filtered and then used to drive an external speaker. As shown in FIG. 1, a signal ANALOG_IN is received by a pulse-width modulator, or PWM 101. PWM 101 generates a signal PWM_OUT, which is a rectangular wave of a frequency defined by a PWM clock CK101. Signal PWM_OUT is then split and fed through level shifter/line driver circuits 103, 104, 105 and 106, to FET's Q107, Q108, Q109 and Q110, respectively, which make up an FET output bridge 121. An inductor L117, a capacitor C119, and an inductor L118 provide output filtering that averages the digital output of the output bridge and provides an analog driving signal across external speaker 120. Speaker 120 can be a single speaker or a set of speakers. When signal PWM_OUT is in a HIGH state, circuit 103 activates FET Q107 and circuit 104 activates FET Q110. At the same time, because an inverter 102 inverts signal PWM_OUT as it is going to circuits 104 and 105, FET's Q108 and Q109 are turned off. As a result, current flows from FET Q107 to FET Q110, through speaker 120. When signal PWM_OUT switches to a LOW state, FET's Q107 and Q110 are turned off, and FET's Q108 and Q109 are activated. Now current flows through speaker 120 in the opposite direction, from FET Q109 to FET Q108. This alternating current flow drives the voice coil in speaker 120, reproducing the original input signal ANALOG_IN as an audio output.

In the FET output bridge of a conventional Class D amplifier, the individual FET's have a limited current sourcing capacity. A short at the FET bridge outputs or an overly large input signal can place excessive current demands on the FET's, leading to possible damage to both the amplifier and the external load. A typical defense against this scenario is to use protective fuses, as illustrated by fuses F111 and F112 in FIG. 1. An over-current situation in FET Q107 would cause fuse F111 to blow before any major damage to the amplifier could occur, while an over-current in FET Q108 would break the link in fuse F112. In either case, however, the blown fuse would have to be replaced before the amplifier would regain functionality. Therefore, although this method provides positive protection against overload, recovery from an over-current incident is cumbersome. A second over-current protection scheme used in conventional Class D amplifiers alleviates some of the inconvenience associated with fuses. Instead of a fuse, a small resistor is placed in series with each FET. The voltage drop across the resistor is monitored, and the amplifier is shut down when the voltage drop exceeds a predefined limit. This implementation is depicted in FIG. 1 by resistors R113 and R114. Comparator circuits 115 and 116 monitor the voltage drops across resistors R113 and R114, respectively, and generate a signal SHUT_DOWN to turn off power to the amplifier when a threshold voltage limit is passed. While this method provides a more precise over-current setpoint and easier recovery from over-current situations, the resistor in the signal path increases power consumption during normal operation, decreasing overall amplifier efficiency. In addition, both of the described methods are a less-than-optimal solution to the scenario in which the excessive currents are caused by a large incoming signal. While a short-circuit definitely requires some sort of immediate examination, a large incoming signal may only be temporary, and is not necessarily indicative of a severe problem. However, conventional protection schemes preclude continuous amplifier output when any over-current situation arises.

Accordingly, it is desirable to provide an over-current protection circuit that consumes low quiescent power and maximizes amplifier output while still preventing damage from short-circuit situations.

SUMMARY OF THE INVENTION

The present invention provides a high-efficiency over-current protection circuit to guard against short circuits while maximizing output power in a Class D amplifier. According to the present invention, the protection circuit includes a tracking circuit to monitor the current flows in the FET output bridge, and a regulation circuit to control excessive incoming signals and shut down the amplifier as required. An embodiment of the tracking circuit includes a current monitor and a comparator circuit. The current monitor can be implemented as a scaled FET in parallel with a selected FET in the FET output bridge. The scaling factor of the scaled FET is made to be very small, so that the tracking current flowing through the selected FET is significantly smaller than the current in the selected FET. A voltage drop generated across a small tracking resistor by this tracking current is sent to the comparator circuit. By making both the tracking current and the tracking resistor small, power consumption of the circuit is minimized. When the voltage drop across the tracking resistor exceeds a predefined reference voltage, the comparator circuit generates an over-current signal. Each of the FET's in the FET output bridge is monitored in this fashion, and the comparator circuit signals are fed to the regulation circuit. Because of the switching nature of the Class D amplifier, only the two FET's of a single "leg" of the FET output bridge are active at any time. The leg that is active while the output signal from the PWM is HIGH is designated as a high leg. The leg that is active when the output signal from the PWM is LOW is designated as a low leg. If an over-current signal is received from the comparator circuit for either of the two FET's in a particular leg, the regulation circuit generates a signal to adjust the PWM output signal duty cycle. If the over-current signal is generated from the high leg, the PWM output signal duty cycle is decreased. If the over-current signal is generated from the low leg, the PWM output signal is increased. If another over-current signal is generated the next time the same leg is active, the PWM output signal is adjusted further. Thus, in the case of an excessively large input signal to the FET output bridge, the over-current protection circuit modulates the signal down to an acceptable level. This enables continuous amplifier output under conditions that would previously have caused the amplifier to shut down. At the same time, logic in the regulation circuit provides proper protection against short-circuit. An excessive input signal to the FET output bridge will cause over-current conditions in either the high or the low leg. However, if the output of the FET output bridge is shorted, both legs will see large currents. The regulation circuit makes use of this fact, and if over-current signals are received from both legs during a single clocking cycle of the PWM, a short-circuit signal is generated which shuts down the amplifier. Thus, even though the regulation circuit is working to maximize the output power of the FET output bridge, proper protection against potentially damaging short-circuits is still provided.

This invention will be more fully understood after consideration of the following detailed description taken along with the accompanying drawings.

BRIEF DESCRIPTION OF THE DRAWINGS

Use of the same reference numbers in different figures indicates similar or like elements.

DETAILED DESCRIPTION OF THE INVENTION

Figure 1:
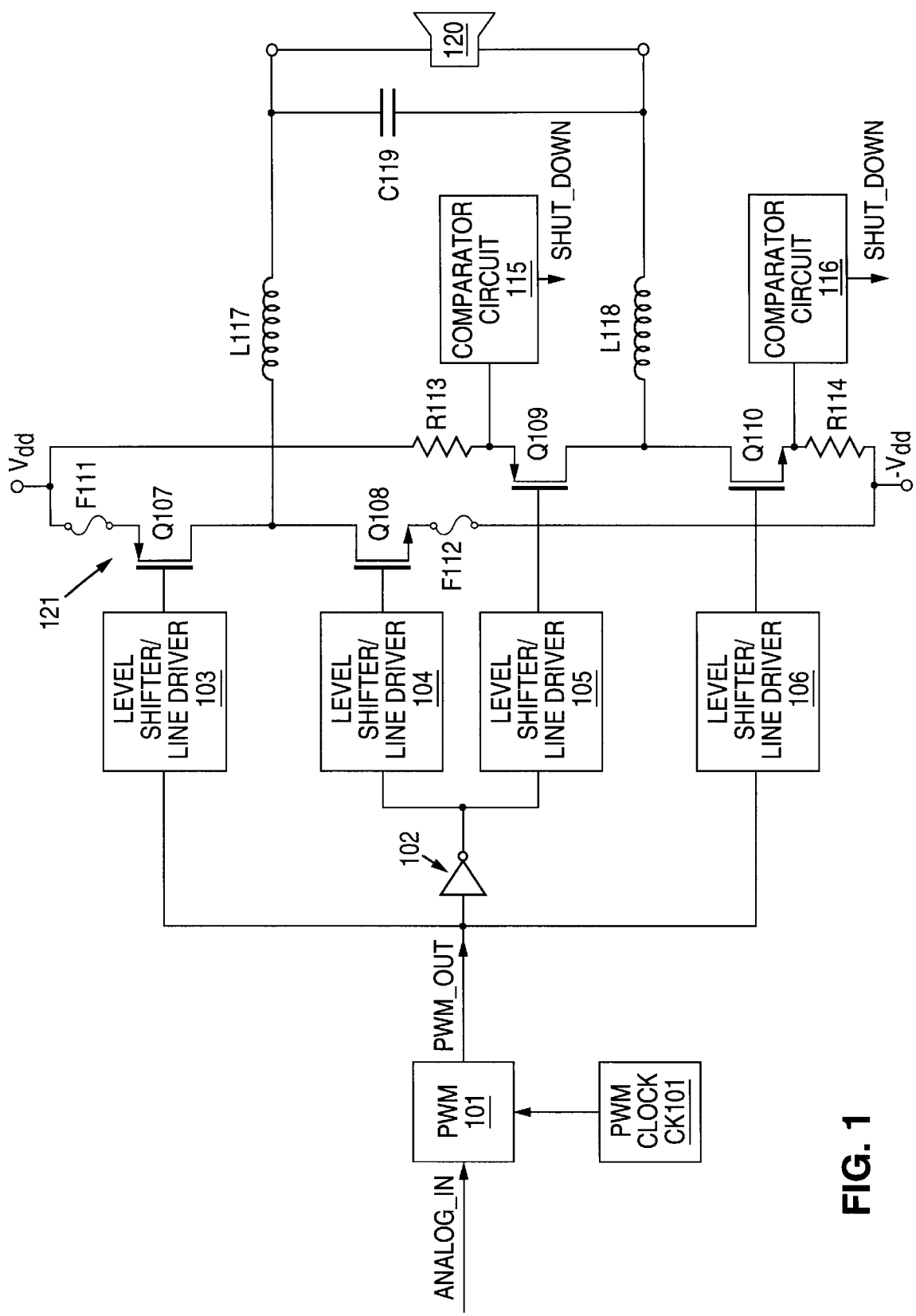
FIG. 1 is an implementation of a conventional Class D amplifier output stage.
Figure 2:
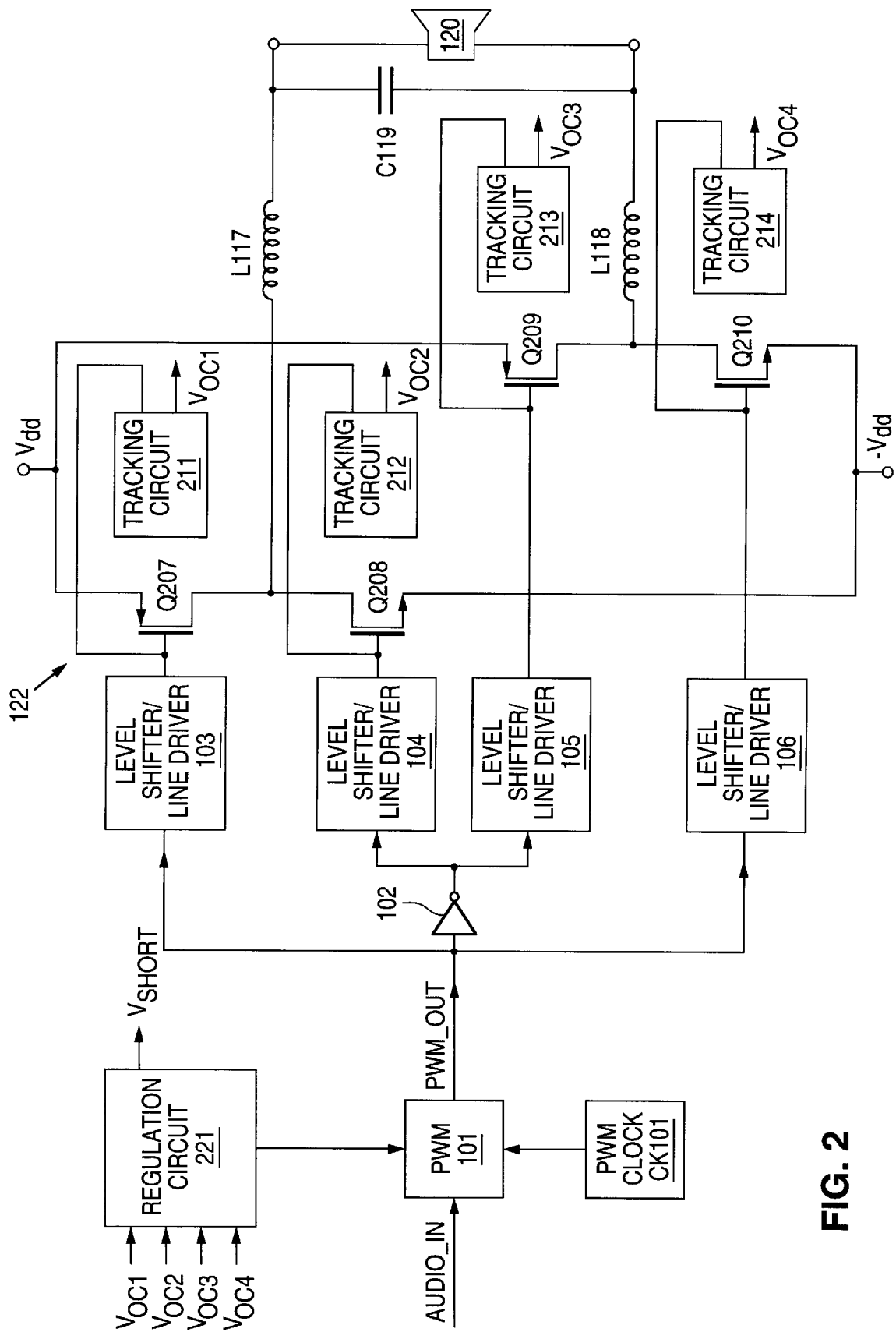
FIG. 2 is an implementation of the current invention for a Class D amplifier output stage that maximizes output power while protecting against short-circuits.

The present invention provides a Class D amplifier output circuit that maximizes output to the external load while protecting against short-circuit conditions. An embodiment of the present invention is shown in FIG. 2. As in a conventional Class D amplifier, an incoming analog signal AUDIO_IN is received by a pulse width modulator, or PWM 101. Using the clocking signal from a reference clock CK101, PWM 101 performs pulse-width modulation on signal AUDIO_IN, transforming it into a digital rectangular wave signal PWM_OUT, which varies between an upper level HIGH_LIMIT and a lower level LOW_LIMIT. Signal PWM_OUT is split and fed into a set of conventional level shifter/line driver circuits 103, 104, 105 and 106, which drive power FET's Q207, Q208, Q209 and Q210, respectively, in an FET output bridge 222. When signal PWM_OUT is at level HIGH_LIMIT, circuits 103 and 106 activate FET's Q207 and Q210, respectively. An inverter 102 inverts signal PWM before circuits 104 and 105, so that FET's Q208 and Q209 are active while signal PWM_OUT is at level LOW_LIMIT. The level shifter/line driver circuits provide an appropriate amount of gain to signal PWM_OUT such that FET output bridge 222 generates an output signal of desired strength. A capacitor C119 and inductors L117 and L118 provide output filtering to convert the digital output signal of FET output bridge 222 back into an analog signal, which drives an external speaker 120.

Figure 3:
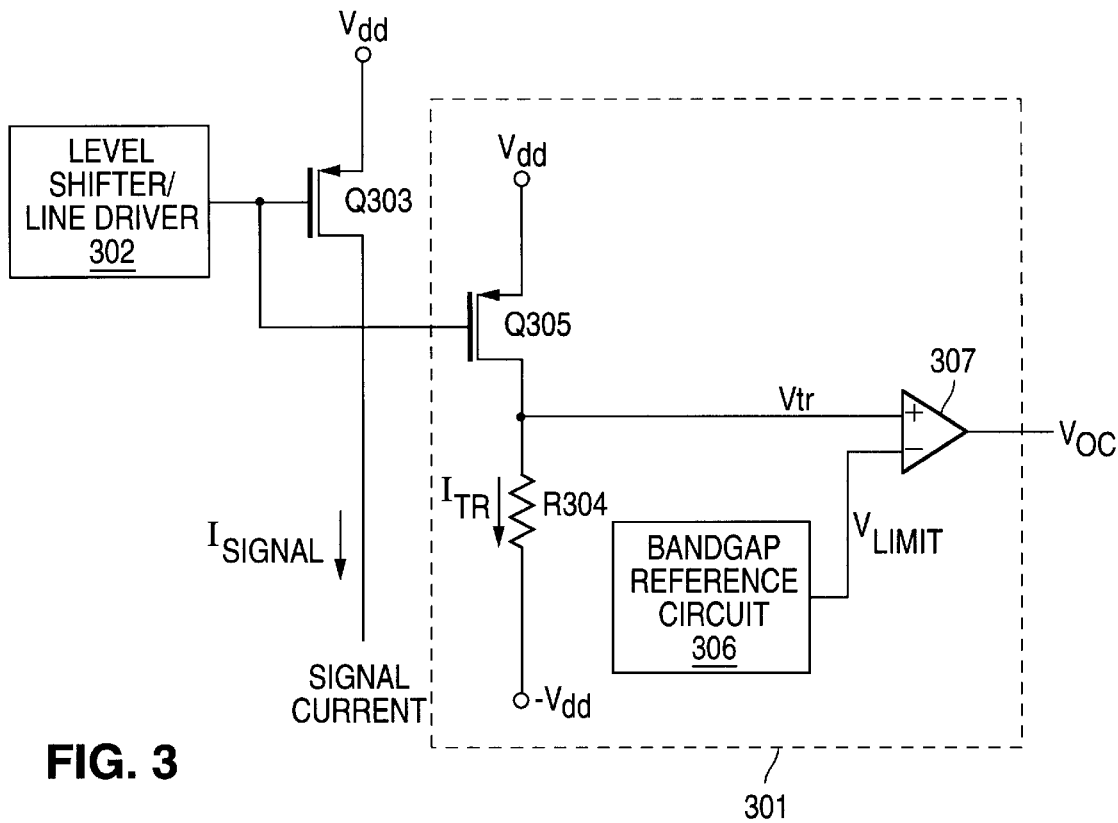
FIG. 3 is an implementation of a tracking circuit of the present invention.

The present invention uses a tracking circuit 211 to monitor the current flowing in power FET Q207 and generate an over-current signal Voc1 when an over-current situation is detected. Similarly, tracking circuits 212, 213, and 214 generate over-current signals Voc2, Voc3, and Voc4, respectively, when excessive currents appear in power FET's Q208, Q209, and Q210, respectively. An embodiment of circuits 211 and 213 is shown by a tracking circuit 301 in FIG. 3. A level shifter/line driver circuit 302 provides a gate voltage to a power FET Q303, which sources a signal current Isignal. A scaled FET Q305 in circuit 301 receives the same gate voltage from circuit 302, and mirrors a scaled current Itr. The magnitude of current Itr equals the magnitude of current Isignal multiplied by the scaling factor N of FET Q305. A resultant voltage Vtr at the junction of FET Q305 and a tracking resistor R304 is then compared with a predefined limit voltage Vlimit generated by a bandgap reference circuit 306. It should be noted that while a bandgap circuit is shown in FIG. 3, any accurate and stable reference voltage source could be used to generate voltage Vlimit. Voltage Vlimit is defined by the following equation:

$$\text{Vlimit} = -Vdd + N*I\text{max}*R304 \qquad (1)$$

where $-Vdd$ is the lower power supply voltage of the circuit, and Imax is the maximum allowable current in FET Q303. A comparator 307 generates an over-current signal Voc when Vtr exceeds Vlimit, indicating that excessive current is flowing in FET Q303. By making R304 and scaling factor N very small, the power consumption of tracking circuit 301 is minimized.

Figure 4:
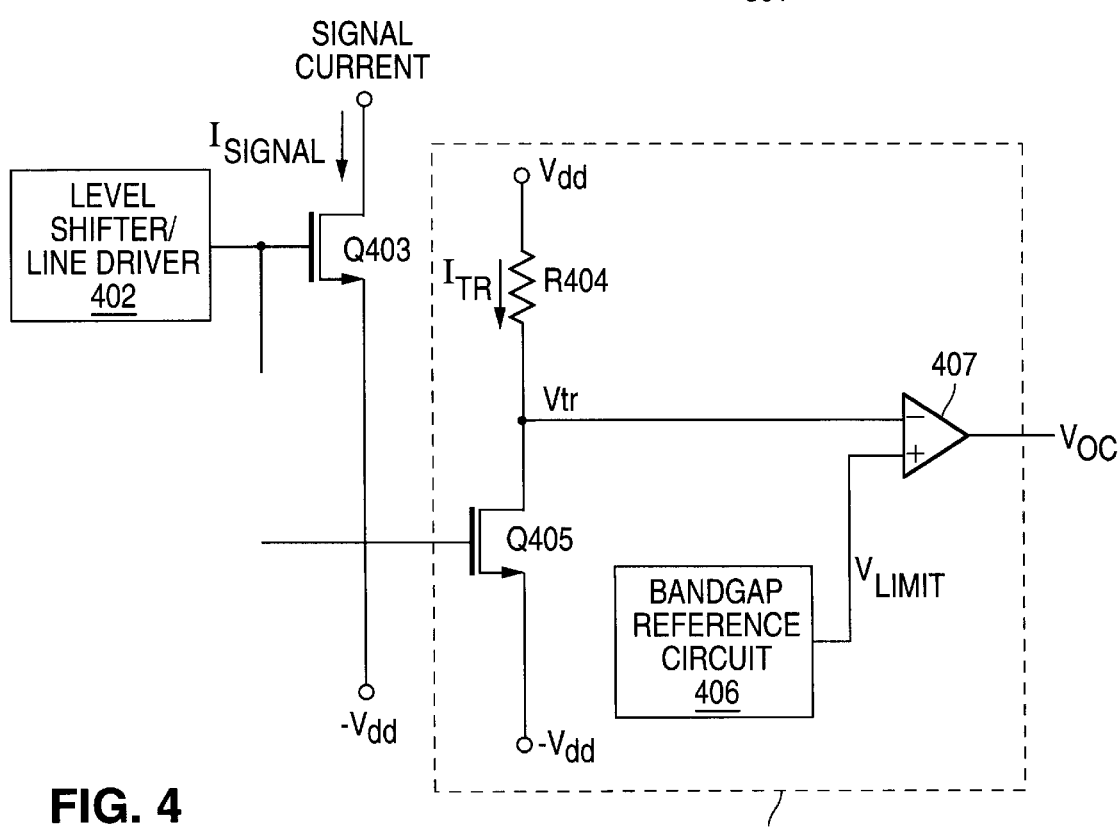
FIG. 4 is an implementation of another tracking circuit of the present invention.

A tracking circuit 401 in FIG. 4 depicts an embodiment of circuits 212 and 214. A level shifter/line driver circuit 402 provides a gate voltage to a power FET Q403, which sinks a signal current Isignal. A scaled FET 405 in circuit 401 receives the same gate voltage from circuit 402, and therefore mirrors a scaled current Itr. The magnitude of current Itr equals the magnitude of current Isignal multiplied by the scaling factor N of FET Q405. A resultant voltage Vtr at the junction of FET Q405 and a tracking resistor R404 is then compared with a predefined limit voltage Vlimit generated by a bandgap reference circuit 406. It should be noted that while a bandgap circuit is shown in FIG. 4, any accurate and stable reference voltage source could be used to generate voltage Vlimit. Voltage Vlimit is defined by the following equation:

$$\text{Vlimit} = Vdd - N*I\text{max}*R404 \qquad (2)$$

where Vdd is the upper power supply voltage of the circuit, and Imax is the maximum allowable current in FET Q403. A comparator 407 generates an over-current signal Voc when Vtr exceeds Vlimit, indicating that excessive current is flowing in FET Q403. By making R404 and scaling factor N very small, the power consumption of tracking circuit 401 is minimized.

Figure 5:
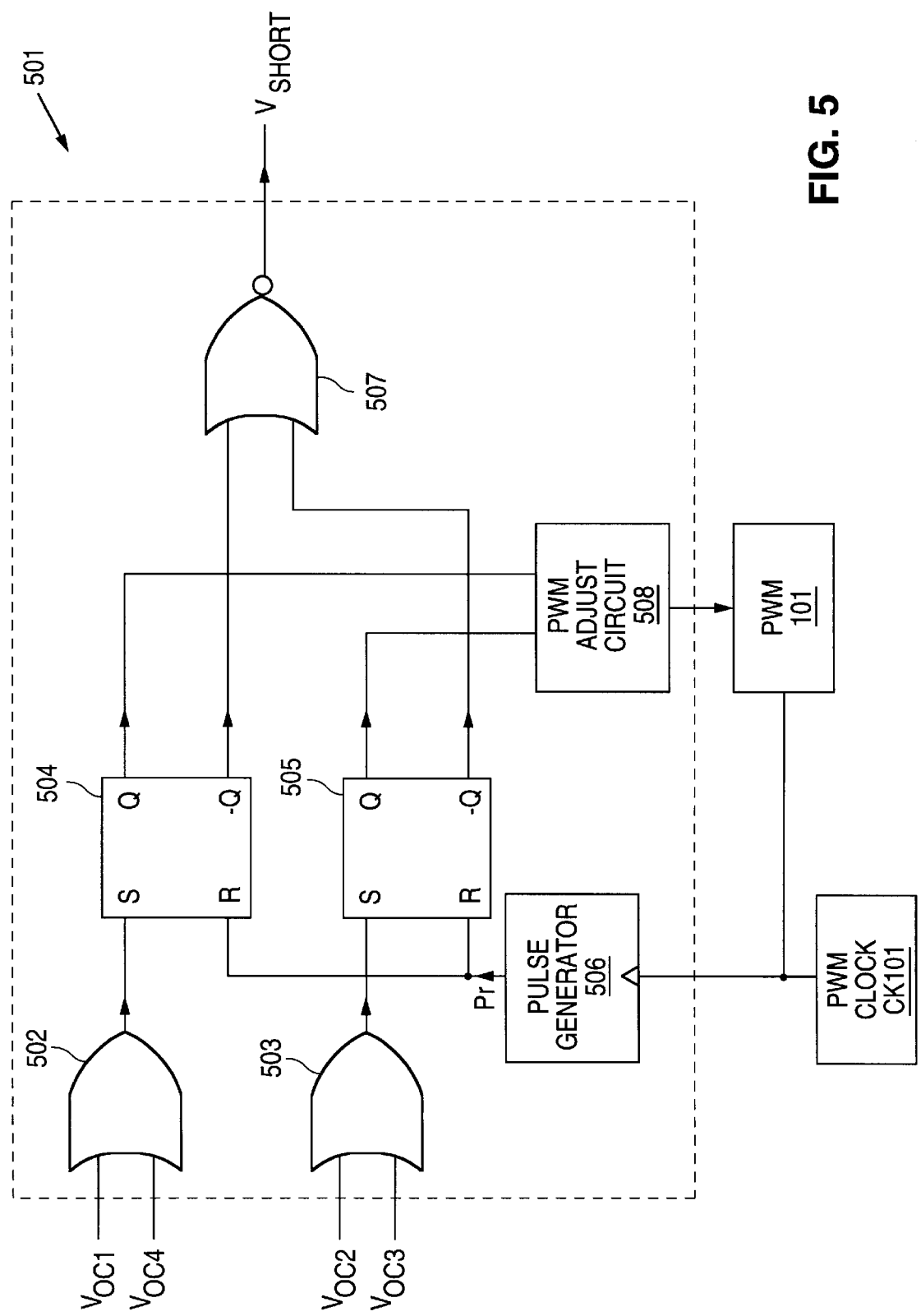
FIG. 5 is an implementation of a PWM regulation circuit of the present invention.

Returning to FIG. 2, the over-current signals Voc1, Voc2, Voc3, and Voc4 are gathered by a regulation circuit 221, which controls the behavior of the amplifier under over-current situations. When an excessive input signal to FET output bridge 222 is detected, circuit 221 modulates the duty cycle of signal PWM_OUT. However, in the case of a short circuit, circuit 221 shuts down the amplifier. An embodiment of circuit 221 is shown in FIG. 5. When an OR gate 502 receives signal Voc1 or Voc4, it asserts a logic HIGH signal at the S terminal of an S-R flip-flop 504. This brings the Q terminal of the flip-flop 504 to a logic HIGH state, indicating that an excessive current is flowing in at least one out of FET Q207 or FET Q210, the active FET's in FET output bridge 222 when signal PWM_OUT is at level HIGH_LIMIT. A PWM adjustment circuit 508 detects the logic HIGH signal at the Q terminal of flip-flop 504 and sends a signal to PWM 101 to decrease the duty cycle of PWM_OUT. Concurrently, a pulse generator 506 driven by PWM clock CK101 produces a reset pulse Pr for every clock cycle of PWM 101. Pulse Pr resets flip-flop 504, bringing its Q terminal back to a LOW state. If another signal Voc1 or Voc4 is received at OR gate 502, the Q terminal of flip-flop 504 is again driven HIGH, causing circuit 508 to further reduce the duty cycle of PWM_OUT. This process continues until the currents in FET Q207 and FET Q210 fall to acceptable levels. On the other hand, an over-current situation while signal PWM_OUT is at level LOW_LIMIT means that at least one of FET's Q208 and Q209 is seeing an excessive current. In that case, a signal Voc2 or Voc3 drives the output of an OR gate 503 HIGH, which in turn causes a flip-flop 505 to assert a logic HIGH state at its Q terminal. PWM adjustment circuit 508 detects the logic HIGH signal at the Q terminal of flip-flop 505 and sends a signal to PWM 101 to increase the duty cycle of PWM_OUT. Pulse Pr resets flip-flop 505, bringing its Q terminal back to a LOW state. If another signal Voc2 or Voc3 is received at OR gate 503, the Q terminal of flip-flop 505 is again driven HIGH, causing circuit 508 to further increase the duty cycle of PWM_OUT. This process continues until the currents in FET Q208 and FET Q209 fall to acceptable levels. In this manner, an overdriving signal is detected and compensated for, and the maximum possible output allowed by FET output bridge operating parameters is produced.

However, if the reason behind an over-current situation is a short on the output of FET output bridge 222, modulation of signal PWM_OUT will not solve the problem. A short across the external load or to either supply will lead to high currents during both the level HIGH_LIMIT and level LOW_LIMIT states of signal PWM_OUT, regardless of duty cycle. The present invention makes use of this fact to distinguish short-circuits from overdriving signals and act accordingly. Because signal PWM_OUT spends time at level HIGH_LIMIT and level LOW_LIMIT during every clock cycle of PWM 101, a short circuit situation will lead to triggering of both flip-flop 504 and flip-flop 505 during a single clock cycle of PWM 101. As can be seen in FIG. 5, an over-current signal during both the HIGH_LIMIT and LOW_LIMIT states of signal PWM_OUT will trigger flip-flop 504 and flip-flop 505, respectively, before pulse Pr from pulse generator 506 can reset either one. When this happens, the -Q terminals on flip-flops 504 and 505 are both at a logic LOW state, causing a NOR gate 507 to generate a signal Vshort, which instructs the amplifier to shut down. Thus, only one clock cycle of PWM 101 is required to detect a short-circuit and immediately shut down the amplifier, before excessive currents can cause any damage.

I claim:

1. In a Class D amplifier having a pulse width modulator (PWM) supplying an input signal to a FET output bridge, an over-current protection circuit comprising:
   (a) a tracking circuit to detect an over-current incident in said FET output bridge comprising:
      (i) a current monitor for each power FET in said FET output bridge; and
      (ii) a comparator circuit to generate an over-current signal whenever the current in said current monitor exceeds a limit current; and
   (b) a regulation circuit to reduce said input signal when said over-current is detected.

2. The circuit of claim 1 wherein said current monitor comprises a tracking FET in parallel with an associated power FET in said FET output bridge, and a reference resistor connected to the source terminal of said tracking FET.

3. The circuit of claim 2 wherein said comparator circuit comprises a reference voltage generator and a comparator, said comparator comparing the voltage generated by said reference voltage generator to the voltage potential at the junction between said reference resistor and said tracking FET.

4. The circuit of claim 2 wherein said tracking FET is scaled to produce a substantially smaller current flow than the current in said associated power FET.

5. The circuit of claim 1 wherein said regulation circuit comprises a PWM adjustment circuit to adjust the output signal of said PWM towards 50% duty cycle when said over-current signal is detected.

6. The circuit of claim 5, wherein said FET output bridge comprises a first bridge output terminal being created by the junction between the source terminal of a first FET and the drain terminal of a second FET, and a second bridge output terminal being created by the junction between the source terminal of a third FET and the drain terminal of a fourth FET, the drain terminals of said first FET and said third FET being connected, and the source terminals of said second FET and said fourth FET being connected, wherein said PWM adjustment circuit comprises:
   a first R-S flip-flop;
   a second R-S flip-flop;
   a first OR gate to assert a logic HIGH signal at the S terminal of said first R-S flip-flop whenever said over-current signal is detected for either said first FET or said fourth FET;
   a second OR gate to assert a logic HIGH signal at the S terminal of said second R-S flip-flop whenever said over-current signal is detected for either said second FET or said third FET;
   a pulse generator to generate a high pulse at every clocking cycle of said PWM, said high pulse being applied to the R terminals of said first R-S flip-flop and said second R-S flip-flop; and
   a modulating circuit to generate a signal to reduce the duty cycle of the signal from said PWM when the Q terminal of said first R-S flip-flop asserts a logic HIGH signal and increase the duty cycle of the signal from said PWM when the Q terminal of said second R-S flip-flop asserts a logic HIGH signal.

7. The circuit of claim 6 wherein said regulation circuit further comprises a short-circuit protection circuit for turning off said Class D amplifier whenever the -Q terminals of both said first R-S flip-flop and said second R-S flip-flop assert logic LOW signals.

8. In a Class D amplifier circuit including a pulse width modulator (PWM) and a FET bridge output stage, a method for regulating output power comprising the steps of:
   (a) monitoring the current in said FET output bridge by:
      (i) producing a scaled mirror current of the current flowing in a specific FET in said FET output bridge;
      (ii) flowing said scaled mirror current across a reference resistor;
      (iii) comparing the voltage drop across said reference resistor with a reference voltage; and
      (iv) generating an over-current signal when the voltage drop across said reference resistor exceeds said reference voltage; and
   (b) adjusting the output signal of said PWM towards 50% when an over-current is detected in said FET output bridge; and
   (c) shutting down said Class D amplifier circuit when a short-circuit is detected in said FET output bridge.

9. The method of claim 8 wherein said adjusting step comprises the steps of:

receiving said over-current signal; and adjusting the duty cycle of the output signal of said PWM a specified amount towards 50%.

10. The method of claim 9 wherein said shutting down step comprises the steps of:

monitoring the clock cycle of said PWM;

detecting when more than one of said over-current signals are generated within a single clock cycle of said PWM; and cutting off power to said Class D amplifier circuit.

* * * * *